United States Patent
Joo et al.

(10) Patent No.: US 9,508,453 B2
(45) Date of Patent: Nov. 29, 2016

(54) SEMICONDUCTOR MEMORY DEVICE AND TEST METHOD OF THE SAME

(75) Inventors: Byoung-In Joo, Gyeonggi-do (KR); Chul-Woo Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 1206 days.

(21) Appl. No.: 13/494,492

(22) Filed: Jun. 12, 2012

(65) Prior Publication Data

US 2013/0166959 A1  Jun. 27, 2013

(30) Foreign Application Priority Data

Dec. 22, 2011  (KR) ................. 10-2011-0140509

(51) Int. Cl.
  *G11C 29/24* (2006.01)
  *G11C 16/20* (2006.01)
  *G11C 15/00* (2006.01)

(52) U.S. Cl.
  CPC ............. *G11C 29/24* (2013.01); *G11C 16/20* (2013.01); *G11C 15/00* (2013.01)

(58) Field of Classification Search
  CPC ........ G11C 29/24; G11C 15/00; G11C 16/20
  See application file for complete search history.

(56) References Cited

U.S. PATENT DOCUMENTS

| | | | | |
|---|---|---|---|---|
| 7,486,559 B2* | 2/2009 | Morooka | ........... | G11C 16/0483 365/185.01 |
| 7,684,242 B2* | 3/2010 | Cha | ........................ | G11C 16/20 365/185.09 |
| 7,808,850 B2* | 10/2010 | Tomita | .................. | G11C 29/12 365/189.07 |
| 8,095,841 B2* | 1/2012 | Kemmerling | .. | G01R 31/318511 714/736 |

FOREIGN PATENT DOCUMENTS

KR  1020050055488  6/2005

* cited by examiner

*Primary Examiner* — Benjamin Geib
(74) *Attorney, Agent, or Firm* — IP & T Group LLP

(57) ABSTRACT

A semiconductor memory device includes a normal data storage block configured to store a normal data, a setup data storage block for storing a setup data including at least two duplicate data, an access unit configured to access the normal data of the normal data storage block or the setup data of the setup data storage block, a first transfer unit configured to transfer the setup data accessed by the access unit, a data decision unit configured to determine a correct data based on the setup data transferred by the first transfer unit, a second transfer unit configured to transfer the normal data accessed by the access unit, and a data output unit configured to output the setup data transferred by the first transfer unit or the normal data transferred by the second transfer unit to the outside of the semiconductor memory device in response to a control signal.

10 Claims, 3 Drawing Sheets

SEMICONDUCTOR MEMORY DEVICE AND TEST METHOD OF THE SAME

CROSS-REFERENCE TO RELATED APPLICATIONS

The present application claims priority of Korean Patent Application No. 10-2011-0140509, filed on Dec. 22, 2011, which is incorporated herein by reference in its entirety.

BACKGROUND

1. Field

Exemplary embodiments of the present invention relate to a semiconductor memory device, and more particularly, to a semiconductor memory device that outputs setup data for the operations of the system including the same.

2. Description of the related art

As the demands for mobile products, such as camcorders, digital cameras, mobile phones, MP3 (Moving Picture Experts Group 1 Layer 3) players and the like are increasing, there are efforts for improving the operation performance of the mobile products.

The internal setup options of non-volatile memory devices are determined depending on the operation characteristics of mobile products to which the non-volatile memory devices are applied, and the non-volatile memory device operates based on a corresponding application program. As new technology is applied to the mobile products, the number of application programs used for each mobile product is increased and accordingly, a technology for allowing diverse setups to a non-volatile memory device is being developed. In the past, the setup data for a non-volatile memory device are stored using a fuse. However, since a fuse occupies a large area, various setup data are being stored using a Content Addressable Memory (CAM) cell instead of a fuse.

Generally, the setup data stored in the CAM cell may be read only, and the information once written in a device by a manufacturer before the device is shipped out of a factory may not be re-written by a user or a controller. For example, a non-volatile memory device, such as a NAND flash memory device, stores diverse setup data in a particular block, which is a CAM cell block. To secure reliability of a CAM cell, the same setup data are repeatedly written in one page and the repeatedly written data are read to be compared through a data decision unit during a read operation, and then the data of a majority is recognized and used as a correct setup data.

Meanwhile, the setup data are outputted to a circuit in need of the setup data after going through the data decision unit, as described above. However, in some occasions, the setup data stored in a CAM cell block are to be outputted, without going through the data decision unit.

SUMMARY

An embodiment of the present invention is directed to a semiconductor memory device that may directly output the setup data stored in a setup data storage block to the outside of a chip.

In accordance with an embodiment of the present invention, a semiconductor memory device includes: a normal data storage block configured to store a normal data; a setup data storage block configured to store a setup data including at least two duplicate data; an access unit configured to access the normal data of the normal data storage block or the setup data of the setup data storage block; a first transfer unit configured to transfer the setup data accessed by the access unit; a data decision unit configured to determine a correct data based on the setup data transferred by the first transfer unit; a second transfer unit configured to transfer the normal data accessed by the access unit; and a data output unit configured to output the setup data transferred by the first transfer unit or the normal data transferred by the second transfer unit to the outside of the semiconductor memory device in response to a control signal.

In accordance with another embodiment of the present invention, a method for testing a semiconductor memory device includes: setting the semiconductor memory device at a test mode; reading a setup data that includes at least two duplicate data and is stored in a setup data storage block; and outputting the setup data that are read to the outside of the semiconductor memory device at the test mode.

In accordance with further embodiment of the present invention, a semiconductor memory device includes: a data decision unit configured to determine a correct data in response to a setup data including at least two duplicate data; a data output unit configured to output the setup data to the outside of the semiconductor memory device in response to a control signal; and a first transfer unit configured to transfer the setup data to the data decision unit and the data output unit in response to the control signal.

DETAILED DESCRIPTION

Figure 1:
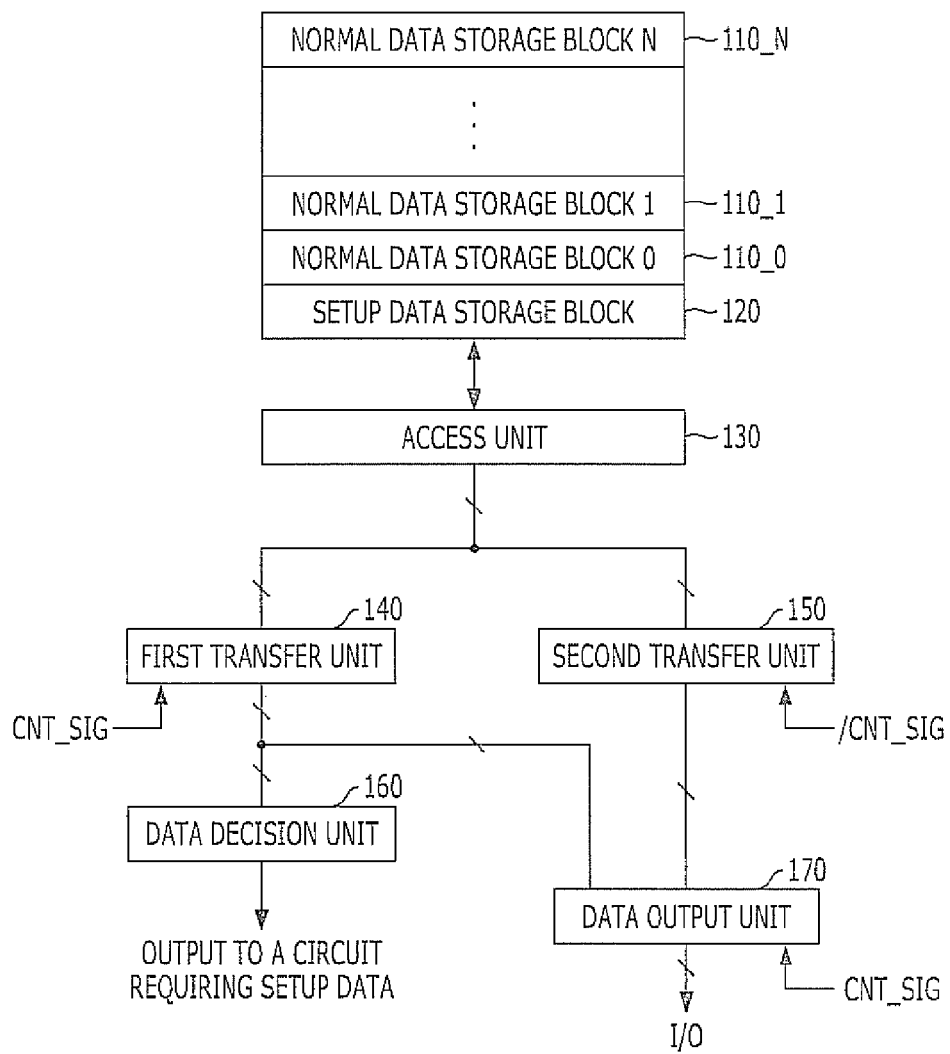
FIG. 1 illustrates a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 illustrates a semiconductor memory device in accordance with an embodiment of the present invention.

The semiconductor memory device may include a plurality of normal data storage blocks 110_0 to 110_N, a setup data storage block 120, an access unit 130, a first transfer unit 140, a second transfer unit 150, a data decision unit 160, and a data output unit 170.

The normal data storage blocks 110_0 to 110_N store normal data. The number and size of the normal data storage blocks 110_0 to 110_N may vary depending on the capacity and integration degree of a memory device.

The setup data storage block 120 stores a setup data, which is an option data. The setup data includes information related to various setups of a memory device and information related to repairing the memory device. Since the capacity of setup data is much smaller than the capacity of normal data, the number and size of pages of the setup data storage block 120 may be set smaller than the normal data storage blocks 110_0 to 110_N.

In the setup data storage block 120, at least two duplicate setup data are stored at different locations. Each of the at least two setup data consists of M bits. Hereinafter, a case that eight setup data consisting of one byte (8 bits), which are the same, are stored in the setup data storage block 120 is described as an example. When the eight setup data are read, the majority numbers of setup data among the eight setup data are decided as a correct data and used as a setup data. Table 1 shows the type of setup data that are stored in the setup data storage block 120.

TABLE 1

Type of setup data stored in the setup data storage block 120

| | $1^{ST}$(CAM_DATA_0) | $2^{ND}$(CAM_DATA_1) | $3^{RD}$(CAM_DATA_2) | ... | $8^{TH}$(CAM_DATA_7) |
|---|---|---|---|---|---|
| CAM_DATA | 11001100 | 11001100 | 11001100 | ... | 11001100 |

It may be seen from Table 1 that the setup data CAM_DATA formed of 8 bits is stored in the setup data storage block 120 eight times. Hereinafter, for purposes of description, the eight setup data, which are the same and are stored at different locations in the setup data storage block 120, are referred to as '8-byte setup data CAM_DATA_0 to CAM_DATA_7'.

The access unit 130 is a structure for accessing the data stored in the normal data storage blocks 110_0 to 110_N and the setup data storage block 120. The access unit 130 is also known as a page buffer array. The access unit 130 performs a program operation for storing data in the normal data storage blocks 110_0 to 110_N and the setup data storage block 120 and performs a read operation for reading data out of the normal data storage blocks 110_0 to 110_N and the setup data storage block 120.

The first transfer unit 140 transfers the 8-byte setup data CAM_DATA_0 to CAM_DATA_7 that are read by the access unit 130 to the data decision unit 160 and the data output unit 170. To be specific, the first transfer unit 140 may be designed to transfer the 8-byte setup data CAM_DATA_0 to CAM_DATA_7 that are read by the access unit 130 to the data decision unit 160 and the data output unit 170 in response to a control signal CNT_SIG. For example, the first transfer unit 140 may be designed to transfer the 8-byte setup data CAM_DATA that are read by the access unit 130 to the data decision unit 160 and the data output unit 170, when the control signal CNT_SIG is activated to a logic high level, and not to transfer the 8-byte setup data CAM_DATA to the data decision unit 160 and the data output unit 170, when the control signal CNT_SIG is deactivated to a logic low level.

The second transfer unit 150 transfers normal data that are read by the access unit 130 to the data output unit 170. To be specific, the second transfer unit 150 may be designed to transfer the normal data that are read by the access unit 130 to the data output unit 170 in response to the control signal CNT_SIG. For example, the second transfer unit 150 may be designed to transfer the normal data that are read by the access unit 130 to the data output unit 170, when the control signal CNT_SIG is deactivated to a logic low level, that is, when the inversion signal /CNT_SIG of the control signal CNT_SIG is activated to a logic high level, and not to transfer the normal data to the data output unit 170, when the control signal CNT_SIG is activated to a logic high level, that is, when the inversion signal /CNT_SIG of the control signal CNT_SIG is deactivated to a logic low level.

The data decision unit 160 determines a correct setup data based on the 8-byte setup data CAM_DATA_0 to CAM_DATA_7 that are transferred by the first transfer unit 140. To be specific, the data decision unit 160 receives the 8-byte setup data CAM_DATA_0 to CAM_DATA_7 through the first transfer unit 140, compares the received 8-byte setup data CAM_DATA_0 to CAM_DATA_7 with each other, and decides the majority data among the 8-byte setup data CAM_DATA_0 to CAM_DATA_7 as the correct setup data. For example, when the 8-byte setup data CAM_DATA_0 to CAM_DATA_7 programmed in the setup data storage block 120 are seven '11001100' and one '10001100', the '11001100' that are programmed seven times is decided as the correct setup data. The '11001100' that is decided as the correct setup data is transferred to a circuit that requires the setup data. To be specific, the data decision unit 160 may include at least one latch and at least one decider. They are described below with reference to FIG. 2.

The data output unit 170 outputs the 8-byte setup data CAM_DATA_0 to CAM_DATA_7 that are transferred by the first transfer unit 140 or the normal data that are transferred by the second transfer unit 150 to the outside in response to the control signal CNT_SIG. In short, the data output unit 170 may be designed to output the 8-byte setup data CAM_DATA_0 to CAM_DATA_7 that are transferred by the first transfer unit 140 to the outside when the control signal CNT_SIG is activated and output the normal data that are transferred by the second transfer unit 150 to the outside when the control signal CNT_SIG is deactivated. To be specific, the data output unit 170 may include a selector 171 and a driver 172. They are described below with reference to FIG. 3.

Figure 2:
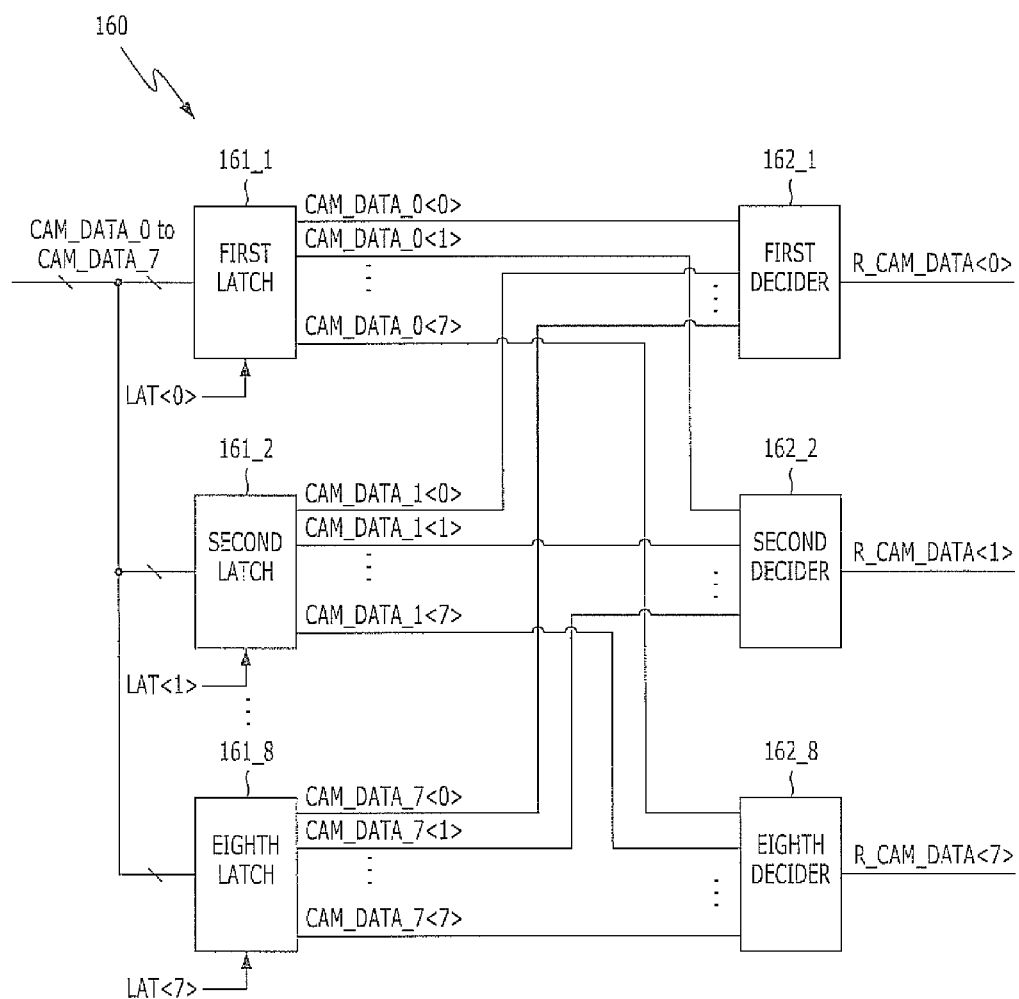
FIG. 2 illustrates a data decision unit 160 shown in FIG. 1.

FIG. 2 illustrates the data decision unit 160 shown in FIG. 1.

The data decision unit 160 may include at least one latch and at least one decider. FIG. 2 exemplarily shows a case that the data decision unit 160 includes eight latches 161_1 to 161_8 and eight deciders 162_1 to 162_8 and the correct setup data is decided based on the 8-byte setup data CAM_DATA_0 to CAM_DATA_7 for the description purpose.

Each of the latches 161_1 to 161_8 latches the 8-byte setup data CAM_DATA_0 to CAM_DATA_7 transferred from the first transfer unit 140 in response to a latch signal LAT<0:7> corresponding to itself. To be specific, a first latch 161_1 latches the setup data CAM_DATA_0<0:7> among the 8-byte setup data CAM_DATA_0 to CAM_DATA_7, when a latch signal LAT<0> corresponding to the first latch 161_1 is activated. A second latch 161_2 latches the setup data CAM_DATA_1<0:7>, when a latch signal LAT<1> corresponding to the second latch 161_2 is activated. An eighth latch 161_8 latches the setup data CAM_DATA_7<0:7>, when a latch signal LAT<7> corresponding to the eighth latch 161_8 is activated.

Each of the first to eighth deciders 162_1 to 162_8 checks whether the number of bits having a value '1' is greater than the number of bits having a value '0' among the bits of an inputted data. When the number of bits having a value '1' is greater than the number of bits having a value '0', the decider outputs '1'. When the number of bits having a value '1' is smaller than the number of bits having a value '0', the decider outputs '0'. For example, when the data CAM_DATA_0<0>, CAM_DATA_1<0>, . . . , CAM_DATA_7<0>, that is inputted to a first decider 162_1, is '1111 1110', the number of bits having a value '1' is greater than the number of bits having a value '0'. Therefore, the first decider 162_1 outputs a setup data R_CAM_DATA<0> having a value '1'.

When the number of bits having a value '1' is greater than the number of bits having a value '0' among the bits of an input data CAM_DATA_0<1>, CAM_DATA_1<1>, . . . , CAM_DATA_7<1> that is inputted to a second decider 162_2, the second decider 162_2 outputs a setup data R_CAM_DATA<1> having a value '1'. In the opposite case, the second decider 162_2 outputs a setup data R_CAM_DATA<1> having a value '0'.

When the number of bits having a value '1' is greater than the number of bits having a value '0' among the bits of an input data CAM_DATA_0<7>, CAM_DATA_1<7>, . . . , CAM_DATA_7<7> that is inputted to an eighth decider 162_8, the eighth decider 162_8 outputs a setup data R_CAM_DATA<7> having a value '1'. In the opposite case, the eighth decider 162_8 outputs a setup data R_CAM_DATA<7> having a value '0'.

The operation of the data decision unit 160 shown in FIG. 2 is described below. For the description purpose, the 8-byte setup data CAM_DATA_0 to CAM_DATA_7 that are transferred from the first transfer unit 140 to the data decision unit 160 are exemplary shown as in the following Table 2.

TABLE 2

Example of 8-byte setup data CAM_DATA_0 to CAM_DATA_7 that are transferred from the first transfer unit 140 to the data decision unit 160

| | CAM DATA |
|---|---|
| 1$^{ST}$ (CAM_DATA_0) | 11001100 |
| 2$^{ND}$ (CAM_DATA_1) | 10001100 |
| 3$^{RD}$ (CAM_DATA_2) | 11001100 |
| 4$^{TH}$ (CAM_DATA_3) | 11001100 |
| 5$^{TH}$ (CAM_DATA_4) | 11001100 |
| 6$^{TH}$ (CAM_DATA_5) | 11001100 |
| 7$^{TH}$ (CAM_DATA_6) | 11001100 |
| 8$^{TH}$ (CAM_DATA_7) | 11001100 |

The first latch 161_1 latches a setup data CAM_DATA_0<0:7> of '11001100' among the 8-byte setup data CAM_DATA_0 to CAM_DATA_7, when a latch signal LAT<0> corresponding to the first latch 161_1 is enabled.

The second latch 161_2 latches a setup data CAM_DATA_1<0:7> of '10001100' among the 8-byte setup data CAM_DATA_0 to CAM_DATA_7, when a latch signal LAT<1> corresponding to the second latch 161_2 is enabled.

Likewise, each of the third to eighth latches 161_3 to 161_8 latches the setup data CAM_DATA_2<0:7> to CAM_DATA_7<0:7> of '11001100'.

The first decider 162_1 decides whether the number of bits having a value '1' is greater than the number of bits having a value '0' among the bits of an inputted data CAM_DATA_0<0>, CAM_DATA_1<0>, . . . , CAM_DATA_7<0>. Since the inputted data CAM_DATA_0<0>, CAM_DATA_1<0>, . . . , CAM_DATA_7<0> is '11111111', the number of bits having a value '1' is greater than the number of bits having a value '0'. Therefore, the first decider 162_1 outputs a setup data R_CAM_DATA<0> having a value '1'.

The second decider 162_2 decides whether the number of bits having a value '1' is greater than the number of bits having a value '0' among the bits of an inputted data CAM_DATA_0<1>, CAM_DATA_1<1>, . . . , CAM_DATA_7<1>. Since the inputted data CAM_DATA_0<1>, CAM_DATA_1<1>, . . . CAM_DATA_7<1> is '10111111', the number of bits having a value '1' is greater than the number of bits having a value '0'. Therefore, the second decider 162_2 outputs a setup data R_CAM_DATA<1> having a value '1'.

In the same manners as described for the above-described operation, the third decider 162_3 outputs a setup data R_CAM_DATA<2> having a value '0', and the fourth decider 162_4 outputs a setup data R_CAM_DATA<3> having a value '0'. The fifth decider 162_5 outputs a setup data R_CAM_DATA<4> having a value '1', and the sixth decider 162_6 outputs a setup data R_CAM_DATA<5> having a value '1'. The seventh decider 162_7 outputs a setup data R_CAM_DATA<6> having a value '0', and the eighth decider 162_8 outputs a setup data R_CAM_DATA<7> having a value '0'.

After all, the setup data R_CAM_DATA<0:7> that are outputted from the first to eighth deciders 162_1 to 162_8 become '11001100'. In short, when the 8-byte setup data CAM_DATA_0 to CAM_DATA_7 inputted to the data decision unit 160 are seven '11001100' and one '10001100', the '11001100' is decided as a correct setup data. The '11001100' that is decided as a correct setup data is outputted to a circuit in need of the setup data.

Figure 3:
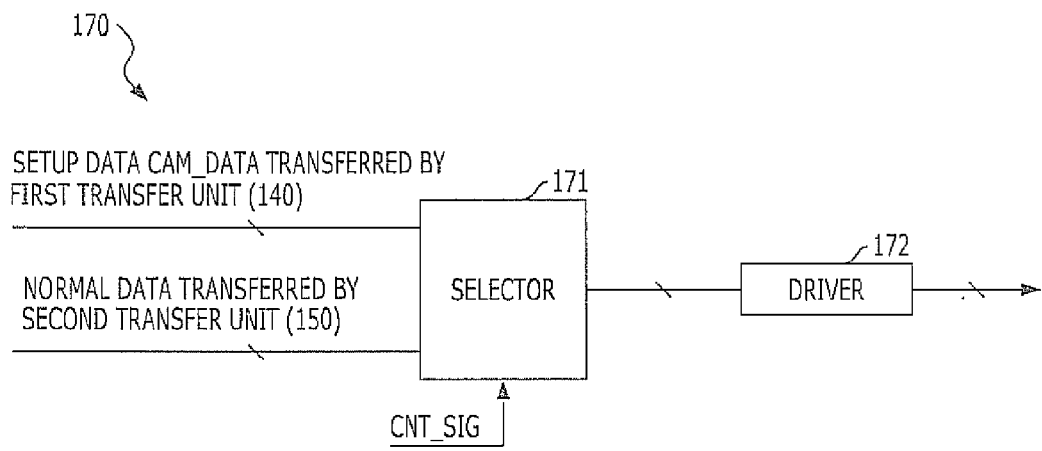
FIG. 3 illustrates a data output unit 170 shown in FIG. 1.

FIG. 3 illustrates the data output unit 170 shown in FIG. 1.

The data output unit 170 may include a selector 171 and a driver 172. The selector 171 selects one among the 8-byte setup data CAM_DATA_0 to CAM_DATA_7 that are transferred by the first transfer unit 140 and the normal data that are transferred by the second transfer unit 150 in response to the control signal CNT_SIG and outputs the selected one to the driver 172.

The driver 172 outputs the selected data to the outside.

Hereinafter, the entire operation of the semiconductor memory device illustrated in FIG. 1 is described.

For the description purpose, a case that the control signal CNT_SIG is designed to be activated in a duration when the initial condition of a chip is set up based on the setup data, which is referred to as an 'initial condition setup duration' hereinafter, and the control signal CNT_SIG is designed to be deactivated in the other durations is described as an example. Also, when the control signal CNT_SIG is activated, the first transfer unit 140 performs the above-described transfer operation, and when the control signal CNT_SIG is deactivated, the second transfer unit 150 performs the above-described transfer operation. When the control signal CNT_SIG is activated, the data output unit 170 outputs a data transferred by the first transfer unit 140 to the outside. When the control signal CNT_SIG is deactivated, the data output unit 170 outputs a data transferred by the second transfer unit 150 to the outside.

In the initial condition setup duration, the access unit 130 reads the 8-byte setup data CAM_DATA_0 to CAM_DATA_7 that are stored in the setup data storage block 120 and transfers the 8-byte setup data CAM_DATA_0 to CAM_DATA_7 to the first transfer unit 140. The first transfer unit 140 transfers the 8-byte setup data CAM_DATA_0 to CAM_DATA_7 to the data decision unit 160 and the data output unit 170 in response to an activated control signal CNT_SIG. Meanwhile, the second transfer unit 150 does not perform a transfer operation because the control signal CNT_SIG is activated.

The data decision unit 160 decides the majority data among the 8-byte setup data CAM_DATA_0 to CAM_DATA_7 as a correct setup data by comparing the inputted 8-byte setup data CAM_DATA_0 to CAM_DATA_7 with each other. For example, when the inputted 8-byte setup data CAM_DATA_0 to CAM_DATA_7 include seven '11001100' and one '10001100', the '11001100' is decided as a correct setup data. The '11001100' that is decided as a correct setup data is outputted to a circuit in need of the setup data.

Meanwhile, when the 8-byte setup data CAM_DATA_0 to CAM_DATA_7 that are transferred by the first transfer unit 140 are inputted to the data output unit 170, the data output unit 170 outputs the 8-byte setup data CAM_DATA_0 to CAM_DATA_7 to the outside in response to an activated control signal CNT_SIG.

When the initial condition setup duration is terminated, the control signal CNT_SIG is deactivated. The first transfer unit 140 does not perform the transfer operation in response to the deactivated control signal CNT_SIG.

If a read command is inputted after the initial condition setup duration is terminated, the access unit 130 reads a normal data stored in a storage block that corresponds to an inputted address among the normal data storage blocks 110_0 to 110_N and transfers the normal data to the second transfer unit 150. The second transfer unit 150 transfers the normal data to the data output unit 170 in response to the deactivated control signal CNT_SIG. The data output unit 170 outputs the normal data transferred by the second transfer unit 150 to the outside in response to the deactivated control signal CNT_SIG.

Figure 4:
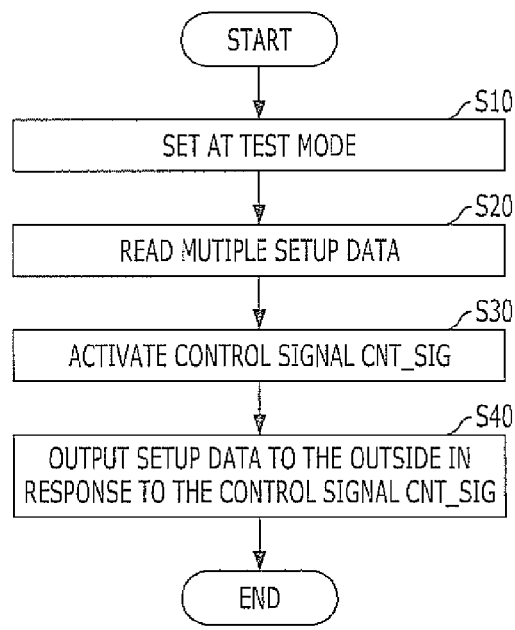
FIG. 4 is a flowchart describing a test operation of the semiconductor memory device shown in FIG. 1.

FIG. 4 is a flowchart describing a test operation of the semiconductor memory device shown in FIG. 1.

First, in step S10, the operation mode of the semiconductor memory device is set at a test mode. The test mode may be set by a Mode Register Set (MRS).

In step S20, the access unit 130 reads the 8-byte setup data CAM_DATA_0 to CAM_DATA_7 that are stored in the setup data storage block 120 and outputs the 8-byte setup data CAM_DATA_0 to CAM_DATA_7 to the first transfer unit 140.

In step S30, the control signal CNT_SIG may be designed to be activated at the test mode.

The first transfer unit 140 transfers the 8-byte setup data CAM_DATA_0 to CAM_DATA_7 that are read by the access unit 130 to the data decision unit 160 and the data output unit 170. To be specific, if the first transfer unit 140 is designed to perform a transfer operation in response to an activated control signal CNT_SIG, the first transfer unit 140 transfers the 8-byte setup data CAM_DATA_0 to CAM_DATA_7 that are read by the access unit 130 to the data decision unit 160 and the data output unit 170 at the test mode because the control signal CNT_SIG is activated at the test mode.

The data decision unit 160 decides the majority data among the 8-byte setup data CAM_DATA_0 to CAM_DATA_7 as a correct setup data by comparing the inputted 8-byte setup data CAM_DATA_0 to CAM_DATA_7 with each other. For example, when the inputted 8-byte setup data CAM_DATA_0 to CAM_DATA_7 include seven '11001100' and one '10001100', the '11001100' is decided as a correct setup data. The '11001100' that is decided as a correct setup data is outputted to a circuit in need of the setup data.

Meanwhile, the 8-byte setup data CAM_DATA_0 to CAM_DATA_7 that are outputted from the first transfer unit 140 may be directly transferred to the data output unit 170 without going through the data decision unit 160.

In step S40, the data output unit 170 outputs the inputted 8-byte setup data CAM_DATA_0 to CAM_DATA_7 to the outside in response to the control signal CNT_SIG. To be specific, if the data output unit 170 is designed to output the data transferred by the first transfer unit 140 to the outside when the control signal CNT_SIG is activated and output the data transferred by the second transfer unit 150 to the outside when the control signal CNT_SIG is deactivated, the data output unit 170 outputs the received 8-byte setup data CAM_DATA_0 to CAM_DATA_7 to the outside at the test mode because the control signal CNT_SIG is activated at the test mode.

As described above, the semiconductor memory device in accordance with an embodiment of the present invention may not additionally include a register for temporarily storing the setup data CAM_DATA in order to output the setup data CAM_DATA that are stored in the setup data storage block 120 to the outside. Therefore, the setup data CAM_DATA may be outputted to the outside while maintaining a small chip area. Also, since the setup data CAM_DATA are transferred to the data output unit 170 not through the second transfer unit 150 but through the first transfer unit 140 which transfers the setup data CAM_DATA to the data decision unit 160, the setup data CAM_DATA that are supposed to be inputted to the data decision unit 160 may be directly outputted to the outside without passing through the data decision unit 160.

According to an embodiment of the present invention, the semiconductor memory device may output the setup data stored in a setup data storage block to the outside while maintaining a small chip area without additionally including an internal register.

While the present invention has been described with respect to the specific embodiments, it will be apparent to those skilled in the art that various changes and modifications may be made without departing from the spirit and scope of the invention as defined in the following claims.

What is claimed is:

1. A method for testing a semiconductor memory device, comprising:
    setting the semiconductor memory device at a test mode;
    reading a setup data that includes at least two duplicate data and is stored in a setup data storage block;
    determining a correct data based on the setup data that is read; and
    outputting the setup data that is read to the outside of the semiconductor memory device at the test mode,
    wherein the determining of the correct data includes:
    comparing the at least two duplicate data with each other; and
    determining majority numbers of data that have the same value among the at least two duplicate data as the correct data,
    wherein the semiconductor memory device stores a normal data,
    wherein the setup data and the normal data are exclusively read.

2. The method of claim 1, further comprising:
activating a control signal at the test mode,
wherein in the outputting of the setup data, the setup data is outputted to the outside of the semiconductor device when the control signal is activated.

3. The method of claim 1, wherein the setting the semiconductor memory device at a test mode includes:
storing the setup data; and
repeatedly storing the setup data.

4. A semiconductor memory device, comprising:
a data decision unit configured to determine a correct data in response to a setup data including at least two duplicate data;
a data output unit configured to output the setup data to the outside of the semiconductor memory device in response to a control signal;
a first transfer unit configured to transfer the setup data to the data decision unit and the data output unit in response to the control signal; and
a second transfer unit configured to transfer a data stored in a storage block of the semiconductor memory device to the data output unit, wherein the data output unit is configured to output the setup data or the data in response to the control signal,
wherein the data decision unit compares the at least two duplicate data with each other and determine majority numbers of data that have the same value among the at least two duplicate data as the correct data,
wherein the first transfer unit is enabled in response to the control signal and the second transfer unit is enabled in response to an inverted control signal, so that the first transfer unit and the second transfer unit are exclusively enabled.

5. The semiconductor memory device of claim 4, wherein the control signal is activated at a test mode of the semiconductor memory device and the data output unit is configured to output the setup data at the test mode.

6. The semiconductor memory device of claim 4, wherein the data decision unit compares corresponding bits of the at least two duplicate data with each other and output majority numbers of bits that have the same value among the corresponding bits as a corresponding bit of the correct data.

7. A semiconductor memory device, comprising:
a normal data storage block configured to store a normal data;
a setup data storage block configured to store a setup data including at least two duplicate data;
an access unit configured to access the normal data of the normal data storage block or the setup data of the setup data storage block;
a first transfer unit configured to transfer the setup data accessed by the access unit;
a data decision unit configured to determine a correct data based on the setup data transferred by the first transfer unit;
a second transfer unit configured to transfer the normal data accessed by the access unit; and
a data output unit configured to output the setup data transferred by the first transfer unit or the normal data transferred by the second transfer unit to the outside of the semiconductor memory device in response to a control signal,
wherein the data decision unit compares the at least two duplicate data with each other and determine majority numbers of data that have the same value among the at least two duplicate data as the correct data,
wherein the first transfer unit is enabled in response to the control signal and the second transfer unit is enabled in response to an inverted control signal, so that the first transfer unit and the second transfer unit are exclusively enabled.

8. The semiconductor memory device of claim 7, wherein the first transfer unit is configured to transfer the setup data accessed by the access unit to the data decision unit and the data output unit in response to the control signal, and
the second transfer unit is configured to transfer the normal data accessed by the access unit to the data output unit in response to the inverted control signal.

9. The semiconductor memory device of claim 7, wherein the data decision unit is configured to compare corresponding bits of the at least two duplicate data with each other and output majority numbers of bits that have the same value among the corresponding bits as a corresponding bit of the correct data.

10. The semiconductor memory device of claim 7, wherein the data output unit comprises:
a selector configured to select one between the setup data transferred by the first transfer unit and the normal data transferred by the second transfer unit in response to the control signal; and
a driver configured to output the selected data to the outside of the semiconductor memory device.

* * * * *